United States Patent [19]

Hulsebusch et al.

[11] 3,895,327

[45] July 15, 1975

[54] CAR RADIO TUNING DEVICE WITH PUSH-BUTTON STATION SELECTOR

[75] Inventors: Theodor Hulsebusch; Hans Prolss, both of Hildesheim, Germany

[73] Assignee: Blaupunkt-Werke GmbH, Hildesheim, Germany

[22] Filed: Sept. 30, 1974

[21] Appl. No.: 510,709

[30] Foreign Application Priority Data

| | | |
|---|---|---|
| Feb. 14, 1974 | Germany | 2406903 |
| Oct. 25, 1973 | Germany | 2353423 |
| Oct. 25, 1973 | Germany | 38297 |

[52] U.S. Cl. .......... 334/7; 74/10.33

[51] Int. Cl.[2] .......... H03V 5/32; F16H 35/18

[58] Field of Search .......... 334/7; 74/10.33

[56] References Cited

UNITED STATES PATENTS

| | | | |
|---|---|---|---|
| 3,233,469 | 2/1966 | Schijven | 334/7 |
| 3,233,470 | 2/1966 | Spakman et al. | 334/7 |
| 3,403,564 | 10/1968 | Ohashi | 334/7 |

FOREIGN PATENTS OR APPLICATIONS

| | | | |
|---|---|---|---|
| 4,616,761 | 5/1971 | Japan | 74/10.33 |
| 4,616,765 | 5/1971 | Japan | 74/10.33 |

*Primary Examiner*—Robert J. Corcoran
*Assistant Examiner*—Wm. H. Punter
*Attorney, Agent, or Firm* —William R. Woodward, Flynn & Frishauf

[57] ABSTRACT

An S-shaped clamping lever is provided with an engagement contour near one extremity that first applies a light preclamping pressure allowing a semicircular half disc to accommodate its position to that of the tuning element set by a tuning knob, as a station selector push-button is first moved from its extreme withdrawn position inwardly. Until this pre-claiming operation is completed, the tuning knob remains coupled to the tuning element of the radio receiver. As the push-button is further actuated inwards an offset arm on a strip-shaped member operates a coupling device to relace the coupling between the tuning knob and the tuning element. The clamping lever then progressively provides more force until it reaches a stable position where the half disc is locked to the tuning slide. The bearing element against which the contour of the clamping lever works is a roller bridging a slot in the inner end of the strip-shaped member and the friction of the engagement is low enough so that if the stable locked position is not reached, a push-button will be restored to its withdrawn position by a leaf spring acting on the clamping lever. If the stable position is reached, the tuning of the selected station is stored by the locking of the half disc.

5 Claims, 3 Drawing Figures

CAR RADIO TUNING DEVICE WITH PUSH-BUTTON STATION SELECTOR

Figure 1:
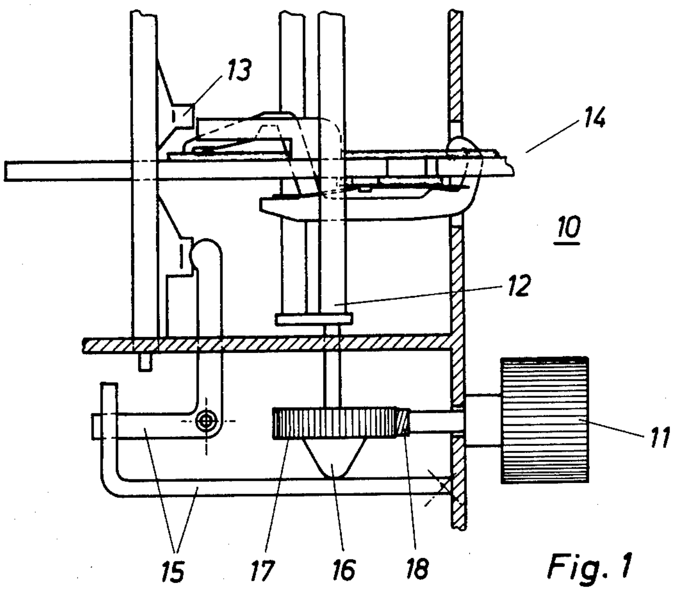

The present invention relates to a tuning device for car radio receivers and more particularly to a tuning device with push buttons that may be set on stations tuned in with the more common type of tuning provided by a tuning knob.

The various button selector units have individual tuning ranges within which they may be locked on a station, usually staggered over the tuning range of the receiver. Tuning devices of this kind have long been known in the art. Setting a push-button on a manually tuned-in station is usually performed in such a manner that a rotatable, substantially semicircular disc, pivotally fitted to a push-button selector unit, feels out with its straight portion the position of a frame-shaped tuning element and is turned to a corresponding position. The disc is then locked in its position by means of a clamping device. On depressing a locked push-button selector unit the tuning knob has to be disengaged from the tuning element, since the tuning element has to assume the position of the disc.

As to the locking process, two different methods are well known to the art. In the German published patent application (DAS) 1,279,138 a method is described wherein the coupling is disengaged during the entire locking operation. This method has the disadvantage that the frame-shaped tuning element is freely pivoted during the entire period in question, as it is no longer engaged with the tuning knob. Violent vibrations, which may occur in a car at any time, can change the adjustment of the tuning element, before the semicircular disc has conformed to and "memorized" the right position. If this disadvantage is avoided by journalling the tuning element subject to strong frictional force, very great forces have to be applied in order to adjust the tuning element by manual knob tuning and by push-button selector units set to various stations. This frequently results in mistuning, mainly when tuning with the push-button selector units, since the person depressing the push-button will easily receive the impression of having sufficiently depressed the push-button when the tuning element has in fact not been accurately set or full operated at that moment.

In the second method described in British Pat. No. 1,029,904, the coupling is engaged during the locking operation, and disengaged only when a locked push-button selector unit is depressed. When the tuning element is connected with the tuning knob during the entire locking process, its position is of course not appreciably influenced by vibrations, but this method has a different disadvantage which may cause audible defects. Whenever a push-button is depressed for the purpose of locking, the force required for locking the clamping lever is transmitted by the semicircular disc to the frame-shaped tuning element. The tuning element thereby suffers a bending effect which acts on the gears between tuning element and tuning knob. Since the tuning knob cannot then turn because of the frictional force provided, resilient deformations of the material occur at the gears. When the push-button selector unit is restored to normal position, the reverse deformation causes a slight rotation of the tuning element. From this effect a detuning of a preadjusted station may result, even in some cases to the point of tuning it out of audibility.

The object of the present invention is to develop a tuning device that does not have the disadvantages above mentioned.

SUBJECT MATTER OF THE PRESENT INVENTION

Briefly, the actuating member is fitted in such a manner to the strip-shaped member moved during the clamping process, that it actuates the coupling device only after a pre-locking of the semicircular disc has been substantially completed. The semicircular disc finds its position under the applied pre-lock friction.

In this manner only the small force necessary for prelocking is applied to the tuning element while the coupling is engaged. The considerably stronger force required for final locking does not cause detuning, as the coupling is already released at the corresponding time. Since the semicircular disc is already clamped by the prelocking when the coupling is disengaged, the disengagement can no longer produce a false setting. Consequently, there is no longer any reason for avoiding a mounting of the tuning element with as little friction as possible and the advantages of having such a mounting are available.

In a preferred embodiment of the invention, the clamping lever is provided with an inclined profile contour which substantially consists of three portions, the first of which is of greater slope and smaller length, the second of greater length but smaller slope, and the third, in clamped condition, is parallel to the tuning slide. In this embodiment the actuating member counted on the stripshaped member is arranged so as to start operating the coupling whenever a bearing portion of the strip-shaped member slides on the second portion of the curve of the clamping lever.

A further advantage is achieved by providing a clamping lever which is substantially S-shaped, with the aforesaid inlcined curve thereof located at that end of the S farther away from the push-button, that end being tapered. The required high clamping force can be achieved by applying only a small force on the push-button selector unit, since the clamping lever permits easy action by means of the tapered end thereof, and by providing a long lever arm for the engagement curve.

Further advantages are achieved by providing a roller for the bearing edge of the strip-shaped member against which the aforesaid curve of the clamping lever leans. This roller bridges an aperture in that end of the strip-shaped member which is away from the push-button, and which runs on the tuning slide. The use of a roller to function as a working edge, improves both the ease of action of the push-button selector unit and the lateral stability of the clamp lever's mounting. Furthermore, the risk is avoided that the locking process may be falsely completed after the pre-locking has taken place, since the push-button selector unit rebounds to its starting position, so long as the roller is not beyond the second portion of the contour, and the final locking is not performed unless the button is pressed home. Consequently, an incomplete operation of that kind is recognizable at once.

Figures 2, 3:
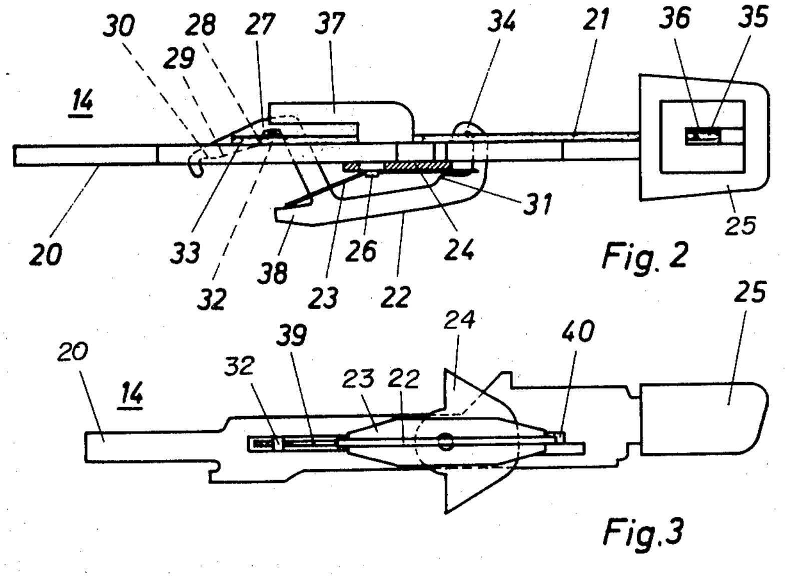

The invention is further described by way of example with reference to the accompanying drawings in which FIG. 1 is a diagrammatic bottom view, partially in section, of one of a group of push-button selector units according to the invention, in locked position forming, together with part of a tuning device of a radio receiver;

FIG. 2 is a bottom view of the push-button selector unit alone, in unlocked position; and FIG. 3 shows a lateral view of the push-button selector unit alone, in locked position.

The figures show those parts of the tuning device 10 which are essential for the present invention. The tuning device includes a tuning knob 11 for continuous manual tuning, a frame-shaped tuning element 12 which changes its position corresponding to the adjustment of the element determining the tuning of the receiver (varicap diode, variometer or other variable capacitance or inductance), a coupling lever 13 which releases the tuning knob 11 from the tuning element 12, whenever said coupling lever 13 is actuated, and a single push-button selector unit 14, the remainer of the tuning device, including other push-button selectors, being broken away and not shown.

When the coupling lever 13 is actuated, a transmission element 15 acts on a device 16 which disengages the two gears 17 and 18 from each other, and thus releases the tuning knob 11 from the tuning element 12.

The FIGS. 2 and 3 show the different members of the push-button selector unit 14. This push-button selector unit comprises a strip-shaped tuning slide 20, a strip-shaped member 21, a clamping lever 22, a leaf spring 23, a more or less semicircular disc 24, and a push-button 25.

The front end of the strip-shaped tuning slide 20 is secured to a guide (not shown) for the push-button 25, its rear end is located in a guide (likewise not shown) in the chassis of a radio receiver, the tuning slide being movable longitudinally in these guides. A spring (likewise not shown) engages the rear end of the tuning slide 20 to restore the original position of the push-button selector unit 14 after depression thereof. On one flat side of the tuning slide 20 there is mounted the substantially semicircular disc 24 on a pivot stud 26. The disc 24 may be clamped in any arbitrary rotary position by means of the clamping lever 22. The clamping lever 22 is substantially S-shaped, and that part of the S disposed towards the push-button 25 is provided near the middle of the S with a lug 38 which projects in the direction away from the push button. A leaf spring 23 presses against the lug 38. That end 27 of clamping lever 22 which extends in the opposite direction in relation to the push-button 25 is provided with an inclined profile or contour 28, 29, 30 at its inner edge. The inclined contour 28, 29, 30 comprises three straight portions. The first 28 is of small length and of steep slope, the second 29 is of greater length but smaller slope wheras the third, short portion 30, in locked condition of the push-button selector unit 14 (FIG. 1), extends in parallel to tuning slide 20 (i.e., zero slope). In order to perform the clamping process the clamping lever 22 is provided near its other end with a bulge 31 by means of which pressure is exerted on the half disc 24.

The clamping lever 22 is so journalled on the tuning slide 20 that it cooperates for clamping purposes with the strip-shaped member 21 which is slidable parallel to tuning slide 20. The central portion of the clamping lever 22 passes through a first aperture 39 of tuning slide 20. Its end 27 which is provided with the inclined countour 28, 29, 30 rests on a roller 32 which bridges the bifurcated end 33 of the strip-shaped member 21, and runs on tuning slide 20.

The force pressing clamping lever 22 against the roller 32 is produced by the leaf spring 23 which is journalled on the pivot 26 against the half-disc 24. The ends of the spring 23 press respectively against the bulge 31 and the lug 38 of the clamping lever. Control of the clamping operation of the push-button selector unit 14, runs along the inclined contour 28, 29, 30, and thereby presses the bulge 31 of the clamping lever 22 against the half disc 24. The fulcrum for the clamping lever 22 is provided by the end 34 of the forward arc of the clamping lever 22, i.e., the arc extending toward the push-button 25. That end 34 passes through a second aperture 40 of tuning slide 20 and is hooked so as to pivot on the aperture edge.

In unlocked condition (FIG. 2), the roller 32 is located in a notch of the lever at the extremity of the first straight portion of the inclined contour 28, 29, 30. After application of a relatively strong force on the push-button 25, the roller 32 gets onto the second straight contour portion 29. It is not before the push-button has completely been compressed, i.e., after completion of final locking of the push-button selector unit 14, that the roller 32 arrives on the third straight contour portion 30, and thus puts the push-button selector unit 14 in a stable position. If the application of force on push-button 25 should be stopped before the final locking has been performed, the push-button selector unit 14 will rebound in the unlocked position, as a stable condition is not possible on the second straight portion 29, due to the low static friction of roller 32.

The strip-shaped member 21 is provided with a hook 35 at its end extending to push-button 25 and this end of the strip-shaped member 21 is bifurcated for the purpose. The hook 35 is pressed into a groove 36 by the elastic force of the bifurcated strip end, the groove being provided in the structure of push-button 25.

The strip-shaped member 21 is provided with an offset L-shaped actuating member 37, the long end of which projects towards coupling lever 13. On inward actuation of the push-button selector unit 14 the conventionally constructed coupling lever 13 is actuated by means of the actuating member 37.

In locked condition (FIG. 1), the inward actuation of the push-button selector unit 14 is caused to move the coupling lever 13 by means the actuating member 37, and thus the tuning knob 11 is disengaged from the tuning element 12. Thereupon, the tuning element 12 is put in the position determined by the clamped disc 24 by means of the latter. Thus, the quick selection of the station previously choosen is performed.

In unlocked condition (FIG. 2), i.e., after withdrawing the push-button selector unit 14, far enough to pull out the strip-shaped member 21, an inward actuation of the push-button causes the now freely movable disc 24 to fit to the position of the tuning element 12, and is first pre-clamped (roller 32 is then located on the second straight portion 29), after which it is finally clamped by further inward actuation. During this process, the coupling lever is actuated only after completion of the pre-clamping. The radio station of which the tuning adjustment is thus stored may later on be repeatedly tuned in by simply pressing in the push-button selector unit 14 as described above, independently of the instantaneous position of the tuning element 12.

Although the invention has been described with reference to a particular embodiment, it will be understood that variations are possible within the inventive concept. For example the member that has been described as a semicircular disc or as a half disc may be a crossmember of different contour extending on both sides of the pivot stud (26) having one straight edge at least approximately aligned with the center of the pivot.

We claim:

1. A tuning device for a car radio comprising, in combination:

a radio tuning element having a rotable shaft and a frame-like portion (12) affixed thereto for movement with the rotation thereof;

a tuning knob and a rotary drive for adjustment of said tuning element;

coupling means (13) for engaging and disengaging said rotary drive for thereby coupling and uncoupling said tuning knob with and from said tuning element; and at least one push-button station selector comprising:

a. a spring-restorable elongated tuning slide (20), mounted slidably for longitudinal motion back and forth and provided with pivot mounting means (26) and with first and second central apertures;

b. a strip-shaped member (21) mounted for longitudinal slidable motion on and parallel to said tuning slide and having first and second apertures and an offset actuating arm (37) for actuating said coupling means, c. a substantially semicircular half disc (24) rotably mounted on said tuning slide (20) by said pivot mounting means (26) thereof;

d. a push-button (25) mounted on an extremity of said strip-shaped member extending beyond the end of said tuning slide;

e. a clamping lever (22) passing through said apertures of said tuning slide (20) and of said strip-shaped member (21) and mounted so that actuation of said push-button (25) from its extreme withdrawn position towards said tuning slide (20) first preclamps said half disc (24) against said tuning slide (20) while allowing it to accomodate its position to that of said frame-like portion (12) of said tuning element against a preclamping frictional force, and thereafter locks said half disc against said tuning slide, f. said offset actuating arm (37) being so located on said strip-shaped member (21) and so dimensional that it does not operate said coupling means (13) to uncouple said tuning knob from said tuning element until the preclamping of said half disc (24) has been substantially completed by said clamping lever (22), but does so actuate said coupling means at the beginning of the operation of locking said half disc.

2. A tuning device as defined in claim 1 in which said clamping lever (22) is provided with an inclined contour (28, 29, 30) substantially consisting of three portions the first of which (28) is of steep slope and small length, the second (29) of greater length but smaller slope, and the third (30) in the locked condition of said push-button station selector is directed parallel to the tuning slide (20), and in which, further, said offset actuating arm (37) of said strip-shaped member (21) is so arranged as to start operating said coupling means (13) to uncouple said tuning knob from said tuning element as soon as a bearing portion of said strip-shaped member (21) slides on said second portion (29) of said inclined contour of said clamping lever (22).

3. A tuning device as defined in claim 1 in which said clamping lever (22) is substantially S-shaped and that adjacent its extremity (27) remote from said push-button (25), which extremity is tapered, said clamping lever has an inclined contour (28, 29, 30) disposed to bear against a portion of said strip-shaped member (21) progressively as said push-button is moved towards said tuning slide.

4. A tuning device as defined in claim 3 in which said clamping lever (22) is hooked at its end near said push-button (25) so as to pivot on an aperture edge of said strip-shaped member (21) and is provided with a bulge (31) on the inside of its arch near said push-button (25) for pressing against said half disc (24) and also with a lug (38) in its mid-portion, and in which, further, leaf spring means (23) are provided having extremities bearing against said bulge (31) and against said lug (38) respectively.

5. A tuning device as defined in claim 2 in which said bearing portion of said strip-shaped member (21) is provided by a roller (32) bridging a slot in said strip-shaped member in that end of said strip-shaped member (21) which is the more remote from said push-button (25), said roller being arranged to run on said tuning slide (20).

* * * * *

UNITED STATES PATENT OFFICE
CERTIFICATE OF CORRECTION

PATENT NO. : 3895327

DATED : July 15, 1975

INVENTOR(S) : Theodor HULSEBUSCH and Hans PROLSS

It is certified that error appears in the above–identified patent and that said Letters Patent are hereby corrected as shown below:

In Column 5 of the patent, Claim 1, third line, correct the spelling of "rotatable".

Signed and Sealed this

*twenty-first* Day of *October 1975*

[SEAL]

*Attest:*

RUTH C. MASON
*Attesting Officer*

C. MARSHALL DANN
*Commissioner of Patents and Trademarks*